(12) United States Patent
Ji et al.

(10) Patent No.: US 10,337,097 B2
(45) Date of Patent: Jul. 2, 2019

(54) MASK FRAME ASSEMBLY, EVAPORATION METHOD, AND ARRAY SUBSTRATE

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Fengli Ji, Beijing (CN); Yinan Liang, Beijing (CN); Shanshan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 411 days.

(21) Appl. No.: 15/262,151

(22) Filed: Sep. 12, 2016

(65) Prior Publication Data

US 2017/0268093 A1    Sep. 21, 2017

(30) Foreign Application Priority Data

Mar. 18, 2016   (CN) .......................... 2016 1 0159061

(51) Int. Cl.
*C23C 14/08*  (2006.01)
*C23C 14/04*  (2006.01)

(52) U.S. Cl.
CPC ................................. *C23C 14/042* (2013.01)

(58) Field of Classification Search
CPC ............. H01J 37/3447; C23C 14/0073; C23C 14/007; C23C 14/08
See application file for complete search history.

(56) References Cited

U.S. PATENT DOCUMENTS

2010/0192856 A1   8/2010  Sung et al.
2012/0164771 A1   6/2012  Lee et al.
2016/0369388 A1   12/2016 Ma et al.

FOREIGN PATENT DOCUMENTS

| CN | 103911584 A | 7/2014 |
| CN | 104611668 A | 5/2015 |
| CN | 105154820 A | 12/2015 |
| KR | 20120074583 A | 7/2012 |

OTHER PUBLICATIONS

First Office Action for Chinese Application No. 201610159061.1, dated Sep. 27, 2017, 5 Pages.

*Primary Examiner* — Robert M Kunemund
(74) *Attorney, Agent, or Firm* — Brooks Kushman P.C.

(57) ABSTRACT

A mask frame assembly, an evaporation method and an array substrate are provided. The mask frame assembly according to the disclosure includes a frame, a covering mask and at least two evaporation masks, the evaporation masks are sequentially arranged on the frame with a gap between two adjacent evaporation masks. A first groove is arranged at a location corresponding to the gap in the frame. The first groove includes a first groove welding portion and a first groove weldless portion, the evaporation mask includes a first evaporation sub-mask corresponding to the first groove welding portion and a second evaporation sub-mask corresponding to the first groove weldless portion; and an edge of the first evaporation sub-mask and an edge of the first groove welding portion coincide.

19 Claims, 3 Drawing Sheets

MASK FRAME ASSEMBLY, EVAPORATION METHOD, AND ARRAY SUBSTRATE

CROSS-REFERENCE TO RELATED APPLICATIONS

This application claims priority to Chinese application No. 201610159061.1, filed Mar. 18, 2016, which is hereby incorporated by reference in its entirety.

TECHNICAL FIELD

The disclosure relates to the field of displays, and in particular, to a mask frame assembly, an evaporation method and an array substrate.

BACKGROUND

Compared with the liquid crystal panel, an OLED in the active matrix light emitting diode (Active Matrix/Organic Light Emitting Diode, AMOLED) panel is self-luminous, rather than using a backlight. The fabrication of the OLED includes evaporating an organic material onto an array substrate, and an evaporation mask is used in evaporating the organic material. Typically, the evaporation mask is welded onto the frame and then is placed in an evaporation chamber. Such structure of welding the evaporation mask and the frame together is called a mask frame assembly (MFA).

However, edges of the evaporation mask may tend to be curled up in the evaporation process, due to heat, magnetic force or other influencing factors, which affects the flatness of the evaporation mask, and finally causes shadow to be formed on a pattern evaporated onto the glass, thereby affecting evaporation effect.

SUMMARY

In view of the problem in the related art that edges of an evaporation mask tend to be curled up in evaporation since the edges of the evaporation mask in a mask frame assembly are unfixed, affecting evaporation effect, a mask frame assembly, an evaporation method and an array substrate are provided according to the present disclosure, which can enable an edge of an evaporation mask to be welded completely on the frame to prevent the edge of the evaporation mask from being curled up in evaporation.

A technical solution used to solve the technical problem in the present disclosure includes a mask frame assembly. The mask frame assembly includes a frame, a covering mask and at least two evaporation masks, the evaporation masks are sequentially arranged on the frame with a gap between two adjacent evaporation masks. A first groove is arranged at a location corresponding to the gap in the frame, and the covering mask is in the first groove. The first groove includes a first groove welding portion and a first groove weldless portion, the evaporation mask includes a first evaporation sub-mask corresponding to the first groove welding portion and a second evaporation sub-mask corresponding to the first groove weldless portion. An edge of the first evaporation sub-mask and an edge of the first groove welding portion coincide.

Further, the evaporation masks are arranged in columns side by side on the frame.

Further, a width of the first groove welding portion is less than a width of the first groove weldless portion.

Further, the covering mask includes a first covering sub-mask in the first groove welding portion and a second covering sub-mask in the first groove weldless portion, and a width of the first covering sub-mask is less than a width of the second covering sub-mask.

Further, an edge of the second evaporation sub-mask covers an edge of the first groove weldless portion.

Further, the mask frame assembly further includes a plurality of welding spots, the welding spots are in a marginal region of the first evaporation sub-mask; and the welding spots weld the evaporation mask with the frame together.

Further, a depth of the first groove is greater than a thickness of the covering mask.

Further, the mask frame assembly further includes a second groove in the frame and a supporting mask in the second groove. The second groove is perpendicular to the first groove. The supporting mask is perpendicular to the covering mask. The supporting mask supports the evaporation mask to prevent the evaporation mask from being curved down in its length direction.

Further, the first covering sub-mask has no overlapping region with the corresponding first evaporation sub-mask; and the second covering sub-mask overlaps with the corresponding second evaporation sub-mask.

Further, a width of the first covering sub-mask is less than or equal to a width of the first groove welding portion.

Further, the second covering sub-mask has an overlapping region with the corresponding second evaporation sub-mask; and an area of the overlapping region is gradually increased in a length direction of the covering mask away from the first groove welding portion.

Further, a width of the first covering sub-mask is less than or equal to a width of the gap.

Further, a width of the first groove weldless portion is gradually increased in a length direction of the covering mask away from the first groove welding portion.

Further, a width of the second covering sub-mask is gradually increased in a length direction of the covering mask away from the first groove welding portion.

Further, a width of the first covering sub-mask is less than or equal to the width of the gap; and the width of the first covering sub-mask is less than the width of the second covering sub-mask.

As another technical solution, an evaporation method is further provided according to the disclosure, which includes: positioning any one of the above-described mask frame assembly above a target substrate; and evaporating material on the target substrate through the mask frame assembly.

As yet another technical solution, an array substrate is further provided according to the disclosure, which is fabricated with the above-described evaporation method.

In the mask frame assembly, the evaporation method and the array substrate according to the disclosure, the mask frame assembly includes a frame, a covering mask and at least two evaporation masks, the evaporation masks are sequentially arranged on the frame with a gap between two adjacent evaporation masks, a first groove is arranged at a location corresponding to the gap in the frame; the first groove includes a first groove welding portion and a first groove weldless portion, the evaporation mask includes a first evaporation sub-mask corresponding to the first groove welding portion and a second evaporation sub-mask corresponding to the first groove weldless portion; and an edge of the first evaporation sub-mask and an edge of the first groove welding portion coincide. The width of the first groove welding portion is reduced, so that the edge of the first evaporation sub-mask have no overlapping portion with the edge of the first groove welding portion, and a distance from a welding spot closest to an edge of the first evaporation sub-mask to the edge of the first evaporation sub-mask may be reduced effectively to be only 0.3 mm, and thus the edge of the evaporation mask is completely welded on the frame. Therefore, the flatness of the evaporation mask is increased, and the edge of the evaporation mask can be prevented from being curled up in evaporation, thereby improving the evaporation effect.

Reference numbers are listed as follows: 10, frame; 1, covering mask; 11, first covering sub-mask; 12, second covering sub-mask; 2, evaporation mask; 21, first evaporation sub-mask; 22, second evaporation sub-mask; 3, first groove; 31, first groove welding portion; 32, first groove weldless portion; 4, welding spot; 5, supporting mask.

DETAILED DESCRIPTION

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In order to make the objects, the technical solutions and the advantages of the present disclosure more apparent, the present disclosure will be described hereinafter in a clear and complete manner in conjunction with the drawings and embodiments.

Figure 1:
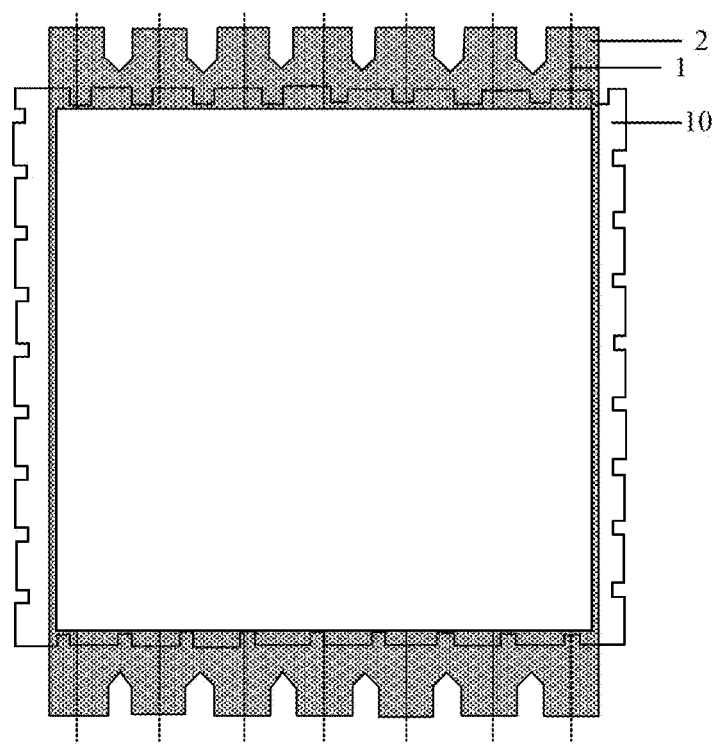
FIG. 1 is a schematic structural diagram of a mask frame assembly in the related art.
Figure 2:
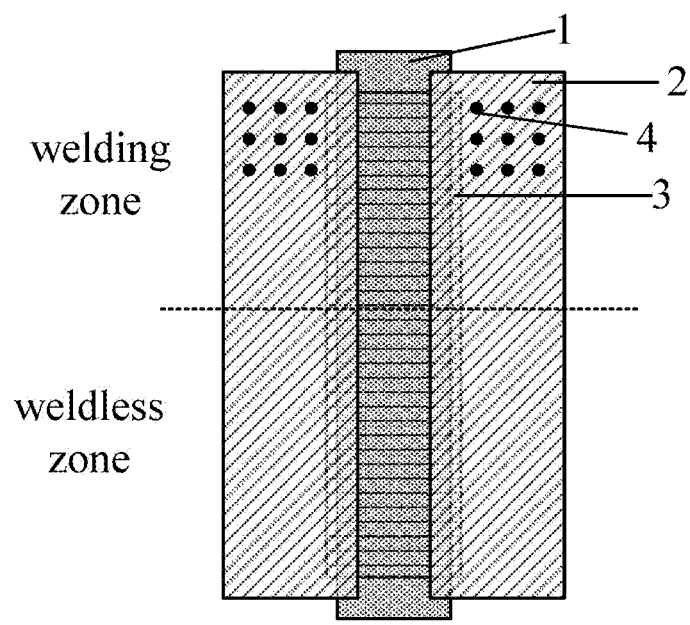
FIG. 2 is an enlarged schematic structural diagram of a portion of a mask frame assembly in the related art.

FIG. 1 is a schematic structural diagram of a mask frame assembly in the related art; and FIG. 2 is an enlarged schematic structural diagram of a portion of the mask frame assembly shown in FIG. 1. Referring to FIG. 1 and FIG. 2, the mask frame assembly includes a frame 10, a plurality of evaporation masks 2 and a plurality of covering masks 1. The plurality of evaporation masks 2 are welded on the frame 10 with a gap between two adjacent evaporation masks 2. A plurality of first grooves 3 is arranged in the frame 10. The first groove 3 corresponds to the gap. The covering mask 1 is arranged in the first groove 3 and covers the gap among the evaporation masks 2. An organic material may be prevented from being evaporated onto the glass in evaporation since the covering mask 1 covers the gap among the evaporation masks 2. However, due to the limitation of production processes, the width of the first groove 3 has a tolerance of about 0.3 mm, and thus a distance of about 0.3 mm is leaved between the first groove 3 and the covering mask 1 at the left side and the right side. In order to ensure the gap to be covered completely by the covering mask 1, the evaporation mask 2 is needed to overlap with the covering mask 1 in a width of 0.5 mm on a general experience. A welding spot 4 for welding the evaporation mask 2 onto the frame 10 is needed to be kept away from the first groove 3, and a distance from a center of the welding spot 4 near the first groove 3 to the edge of the first groove 3 is greater than 0.3 mm. Therefore, a distance from the welding spot 4 near the first groove 3 on the evaporation mask 2 to the edge of the evaporation mask 2 is of 0.5 mm+0.3 mm+0.3 mm=1.1 mm.

The mask frame assembly in the related art has at least problems as follows. After the evaporation mask 2 is welded on the frame 10, the edges of the evaporation mask 2 in a width of 1.1 mm are not welded on the frame 10. Since not all edges of the evaporation mask 2 can be welded on the frame 10, the edges of the evaporation mask 2 are unfixed and may be curled up. When the mask frame assembly is attracted by a magnet in an evaporation chamber, the edges of the evaporation mask 2 are curled up more seriously, which seriously affects the flatness of the evaporation mask 2 and finally causes shadow to be formed on a pattern evaporated onto the glass, thereby affecting the evaporation effect.

Figure 3:
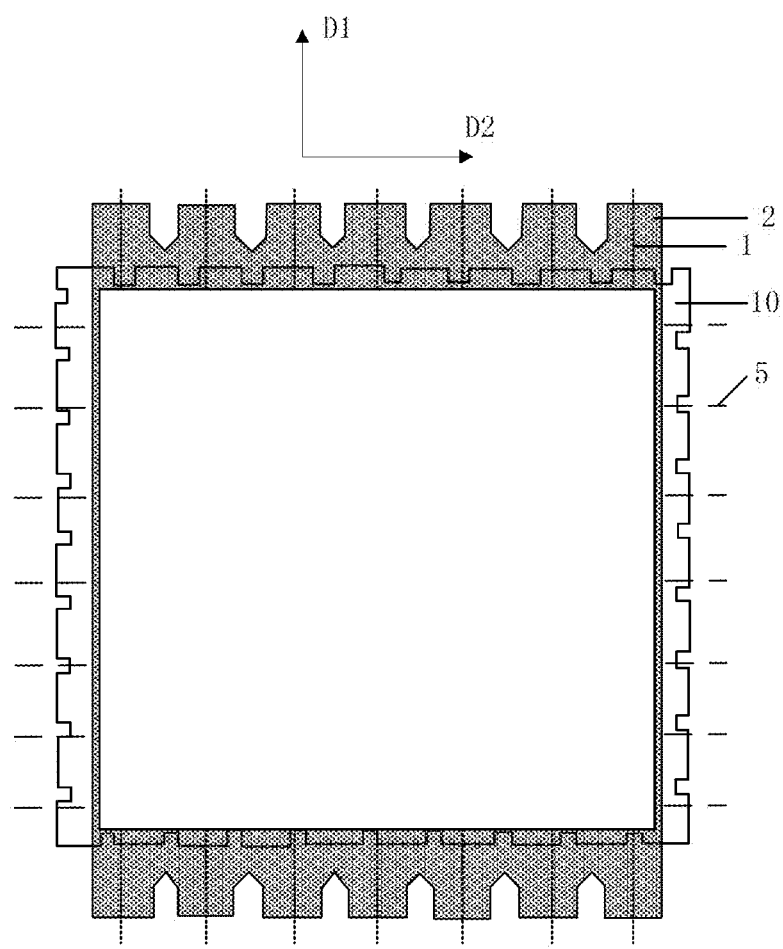
FIG. 3 is a schematic structural diagram of a mask frame assembly according to at least some embodiments of the disclosure.
Figure 4:
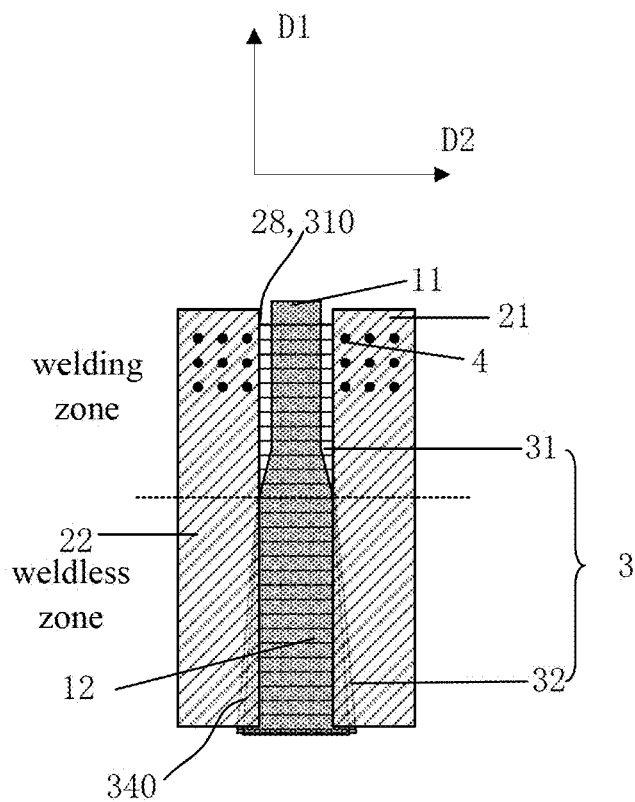
FIG. 4 is an enlarged schematic structural diagram of a portion of the mask frame assembly shown in FIG. 3.

Referring to FIG. 3 and FIG. 4, a mask frame assembly is provided according to at least some embodiments of the disclosure, which includes a frame 10, a covering mask 1 and at least two evaporation masks 2. The evaporation masks 2 are sequentially arranged on the frame 10 with a gap between two adjacent evaporation masks 2. A first groove 3 is arranged at a location corresponding to the gap on the frame 10. The first groove 3 includes a first groove welding portion 31 and a first groove weldless portion 32. The evaporation mask 2 includes a first evaporation sub-mask 21 corresponding to the first groove welding portion 31 and a second evaporation sub-mask 22 corresponding to the first groove weldless portion 32. An edge 28 of the first evaporation sub-mask 21 and an edge of the first groove welding portion 31 coincide.

As can be seen from FIG. 4, in a welding zone, the first groove welding portion 31 is just arranged between two adjacent first evaporation sub-masks 21, and each of two long edges 310 of the first groove welding portion 31 in a length direction, i.e., a first direction D1, and the corresponding edge 28 of the two first evaporation sub-masks 21 adjacent to the first groove welding portion 31 coincide. That is, a width of the first groove welding portion 31 in a width direction, i.e., a second direction D2, is reduced so that each of the two long edges 310 of the first groove welding portion 31 and the corresponding edge of the two first evaporation sub-masks 21 adjacent to the first groove welding portion 31 coincide. Therefore, there is no need to control the first groove welding portion 31 to partly overlap with the edges of two first evaporation sub-masks 21 adjacent to the first groove welding portion 31 in welding, a most marginal welding spot may be arranged at the edge of the first evaporation sub-mask 21, and thus the edge of the evaporation mask 2 are completely welded on the frame 10.

The evaporation masks 2 are arranged in columns side by side on the frame 10. This arrangement is so, in order to control the gaps among the evaporation masks 2 to be of the same width, but also a width of a portion of one gap in the welding zone can be the same as a width of a portion of the same gap in the weldless zone.

A width of the first groove welding portion 31 is less than a width of the first groove weldless portion 32. An edge of the second evaporation sub-mask 22 covers an edge of the first groove weldless portion 32. This arrangement is so because the evaporation range related in the evaporation process is located in the weldless zone, rather than the welding zone. That is, a portion of the covering mask 1 in the first groove welding portion 31 is not needed to cover the gap between two adjacent first evaporation sub-masks 21 completely in the welding zone, but a portion of the covering mask 1 in the first groove weldless portion 32 is needed to cover the gap between two adjacent second evaporation sub-masks 22 completely in the weldless zone. The width of the first groove welding portion 31 is the same as the width of the gap between two adjacent first evaporation sub-masks 21, if the width of the first groove weldless portion 32 is also the same as the width of the gap between two adjacent second evaporation sub-masks 22, the covering mask 1 cannot basically cover evaporation materials completely due to tolerance on size. Only if the width of the first groove welding portion 31 is less than the width of the first groove weldless portion 32, that is, the first groove weldless portion 32 partly overlaps with the second evaporation sub-mask 22, the covering mask 1 arranged in the first groove weldless portion 32 can cover the gap between two adjacent second evaporation sub-masks 22 completely.

The covering mask 1 includes a first covering sub-mask 11 arranged in the first groove welding portion 31 and a second covering sub-mask 12 arranged in the first groove weldless portion 32. A width of the first covering sub-mask 11 is less than a width of the second covering sub-mask 12. This arrangement is so because the first covering sub-mask 11 and the second covering sub-mask 12 are respectively arranged in the first groove welding portion 31 and the first groove weldless portion 32. On the premise that the width of the first groove welding portion 31 is less than the width of the first groove weldless portion 32, the width of the first covering sub-mask 11 is less than the width of the second covering sub-mask 12, in order that a distance of about 0.3 mm remains between the first groove 3 and the covering mask 1 at the left side and the right side.

As shown in FIG. 4, in some embodiments, the width of the second covering sub-mask 12 is gradually increased in a length direction, i.e., the first direction D1, of the covering mask 1 away from the first groove welding portion 31. The second covering sub-mask 12 has an overlapping region 340 with the corresponding second evaporation sub-mask 22. An area of the overlapping region 340 is gradually increased in a length direction, i.e., the first direction D1, of the covering mask 1 away from the first groove welding portion 31. The width of the first groove weldless portion 32 is gradually increased in a length direction, i.e., the first direction D1, of the covering mask 1 away from the first groove welding portion 31. The mask frame assembly further includes a plurality of welding spots 4. The welding spots 4 are arranged in a marginal region of the first evaporation sub-mask 21. The welding spots 4 are used to weld the evaporation mask 2 with the frame 10 together.

Referring to FIG. 4, the plurality of welding spots 4 are arranged in the welding zone. Since the welding spots 4 are used to weld the evaporation mask 2 with the frame 10 together, the welding spots 4 are arranged at locations closer to the edge 28 of the first evaporation sub-mask 21, it is more beneficial to fix the evaporation mask 2, so that the edges of the evaporation mask 2 cannot be curled up in the evaporation process. In this embodiment, a distance between the welding spot 4 and the edge of the evaporation mask 2 is shorter, and the distance from the center of the welding spot 4 closest to the edge 28 of the first evaporation sub-mask 21 to the edge 28 of the first evaporation sub-mask 21 may be of 0.3 mm; compared with a distance of 1.1 mm in the related art, the evaporation mask 2 and the frame 10 can be better fixed together, thereby preventing the evaporation mask 2 from being curled up.

The mask frame assembly further includes: a second groove in the frame 10 and a supporting mask 5 arranged in the second groove. The second groove is perpendicular to the first groove 3. The supporting mask 5 is perpendicular to the covering mask 1. The supporting mask 5 is used to support the evaporation mask 2 to prevent the evaporation mask 2 from being curved down in its length direction.

Referring to FIG. 3, the plurality of evaporation masks 2 are arranged in the first direction D1 and arranged side by side in the second direction D2 on the frame 10. The first direction D1 refers to a length direction of the evaporation mask 2. Since the length of the evaporation mask 2 is long, the evaporation mask 2 may be curved down due to the gravity in use. In order to overcome the problem of the evaporation mask 2 being curved down, the supporting mask 5 for supporting the evaporation mask 2 may be arranged in the second direction D2 perpendicular to the length direction of the evaporation mask 2 (i.e., the first direction D1). That is, in this embodiment, the covering mask 1 is arranged in the first direction D1 to cover the gap between two adjacent evaporation masks 2, and the supporting mask 5 is arranged in the second direction D2 to supply supporting forces for the evaporation masks 2, thereby preventing the evaporation masks 2 from being curved down in the length direction.

A depth of the first groove 3 is greater than a thickness of the covering mask 1.

It should be noted that if the covering mask 1, the supporting mask 5 and the evaporation mask 2 are arranged on the frame 10 and finally the surface of the evaporation mask 2 is flat, firstly, grooves needed for welding the covering mask 1 and the supporting mask 5 are formed in the frame 10, so that the masks of two types are welded in the grooves, and then the evaporation mask 2 is welded on the surface of the frame 10. In a first step, the first groove 3 for arranging the covering mask 1 is formed in the frame 10. The depth of the first groove 3 is deepest, and the depth of the first groove 3 is related to thicknesses of the covering mask 1 and the supporting mask 5. For example, assumed that the thickness of the covering mask 1 is a and the thickness of the supporting mask 5 is b, then, the depth of the first groove 3 is equal to a+b+0.01 mm, where 0.01 mm is a setting margin. In a second step, the second groove for arranging the supporting mask 5 is formed in the frame 10. A depth of the second groove is related to the thickness of the supporting mask 5, and the depth of the second groove is equal to b+0.01 mm (a setting margin). In a third step, the covering mask 1 is welded into the first groove 3, and the supporting mask 5 is welded into the second groove. In a fourth step, the evaporation mask 2 is welded on the surface of the frame 10. Thus, the covering mask 1 is completely arranged into the first groove 3 and the supporting mask 5 is completely arranged into the second groove, that is, the covering mask 1 and the supporting mask 5 cannot be seen on the surface of the frame 10 from the first direction D1 or the second direction D2 when the evaporation mask 2 is not welded. Therefore, the evaporation mask 2 can remain in a flat state after being welded on the surface of the frame 10.

The mask frame assembly according to the embodiment includes the frame 10, the covering mask 1 and at least two evaporation masks 2, the evaporation masks 2 are sequentially arranged on the frame 10 with a gap between two adjacent evaporation masks 2, the first groove 3 is arranged at a location corresponding to the gap in the frame 10; the first groove 3 includes the first groove welding portion 31 and the first groove weldless portion 32, the evaporation mask 2 includes the first evaporation sub-mask 21 corresponding to the first groove welding portion 31 and the second evaporation sub-mask 22 corresponding to the first groove weldless portion 32; and the edge 28 of the first evaporation sub-mask 21 and the edge of the first groove welding portion 31 coincide. The width of the first groove welding portion 31 is reduced, so that the edge of the first evaporation sub-mask 21 have no overlapping portion with the edge of the first groove welding portion 31, and a distance from the welding spot 4 closest to the edge of the first evaporation sub-mask 21 to the edge of the first evaporation sub-mask 21 may be reduced effectively to be only 0.3 mm, and thus the edge of the evaporation mask 2 is completely welded on the frame 10. Therefore, the flatness of the evaporation mask 2 is increased, and the edge of the evaporation mask 2 can be prevented from being curled up in evaporation, thereby improving the evaporation effect.

Figure 5:
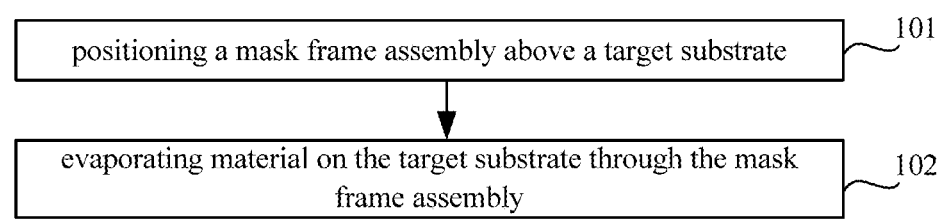
FIG. 5 is a schematic flowchart of an evaporation method according to at least some embodiments of the disclosure.

Referring to FIG. 5, an evaporation method is provided according to at least some embodiments of the disclosure, which includes steps 101 and 102.

Step 101 is to position a mask frame assembly above a target substrate.

The mask frame assembly may be the mask frame assembly according to the above-described embodiments, which is not repeated any more herein.

Step 102 is to evaporate material on the target substrate through the mask frame assembly.

In the evaporation method according to the embodiment, the mask frame assembly according to the above-described embodiments is used, the width of the first groove welding portion 31 is reduced so that the edge 28 of the first evaporation sub-mask 21 have no overlapping portion with the edge of the first groove welding portion 31, and a distance from the welding spot 4 closest to the edge of the first evaporation sub-mask 21 to the edge of the first evaporation sub-mask 21 may be reduced effectively to be only 0.3 mm, and thus the edge of the evaporation mask 2 is completely welded on the frame 10. Therefore, the flatness of the evaporation mask 2 is increased, and the edge of the evaporation mask 2 can be prevented from being curled up in evaporation, thereby improving the evaporation effect.

An array substrate is provided according to one embodiment of the disclosure, which is fabricated with the evaporation method according to the above-described embodiment. The array substrate may be applied in a display panel and is arranged oppositely with a color substrate to form a cell.

Since the array substrate according to the embodiment is fabricated with the evaporation method according to the above-described embodiment, the edge of the evaporation mask 2 are prevented from being curled up in evaporation, the evaporated pattern of the fabricated array substrate is uniform without shadow.

It can be understood that the above-described embodiments are only exemplary embodiments to illustrate the principle of the present disclosure, but the disclosure is not limited thereto. For those skilled in the art, various changes and modifications may be made to the disclosure without departing from the spirit and scope of the disclosure, and these changes and modifications fall into the protective scope of the disclosure.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A mask frame assembly, comprising:
a frame;
a covering mask;
at least two evaporation masks sequentially arranged on the frame with a gap between two adjacent evaporation masks;
a first groove in the frame at a location corresponding to the gap;
wherein at least one portion of the covering mask is in the first groove;
wherein the first groove comprises a first groove welding portion and a first groove weldless portion; each of the two adjacent evaporation masks comprises a first evaporation sub-mask corresponding to the first groove welding portion and a second evaporation sub-mask corresponding to the first groove weldless portion; and, for each of the two adjacent evaporation masks, an edge of the first evaporation sub-mask and an edge of the first groove welding portion coincide.

2. The mask frame assembly according to claim 1, wherein the evaporation masks are arranged in columns side by side on the frame.

3. The mask frame assembly according to claim 1, wherein a width of the first groove welding portion is less than a width of the first groove weldless portion.

4. The mask frame assembly according to claim 3, wherein the covering mask comprises a first covering sub-mask in the first groove welding portion and a second covering sub-mask in the first groove weldless portion, and a width of the first covering sub-mask is less than a width of the second covering sub-mask.

5. The mask frame assembly according to claim 1, wherein an edge of the second evaporation sub-mask of one of the two adjacent evaporation masks covers an edge of the first groove weldless portion.

6. The mask frame assembly according to claim 1, further comprising a plurality of welding spots, wherein the welding spots are in a marginal region of the first evaporation sub-mask of one of the two adjacent evaporation masks, and the welding spots weld together the one evaporation mask and the frame.

7. The mask frame assembly according to claim 1, wherein a depth of the first groove is greater than a thickness of the covering mask.

8. The mask frame assembly according to claim 1, further comprising a second groove in the frame and a supporting mask in the second groove;
wherein the second groove is perpendicular to the first groove; the supporting mask is perpendicular to the covering mask; and the supporting mask supports one of the two evaporation masks.

9. The mask frame assembly according to claim 1, wherein the covering mask comprises a first covering sub-mask in the first groove welding portion and a second covering sub-mask in the first groove weldless portion.

10. The mask frame assembly according to claim 9, wherein the first covering sub-mask has no overlapping region with the first evaporation sub-mask of each of the two adjacent evaporation masks; and the second covering sub-mask overlaps with the second evaporation sub-mask of each of the two adjacent evaporation masks.

11. The mask frame assembly according to claim 10, wherein a width of the first covering sub-mask is less than or equal to a width of the first groove welding portion.

12. The mask frame assembly according to claim 10, wherein a width of the first groove welding portion is less than a width of the first groove weldless portion.

13. The mask frame assembly according to claim 9, wherein the second covering sub-mask has an overlapping region with the second evaporation sub-mask of each of the two adjacent evaporation masks; and an area of each overlapping region is gradually increased in a length direction of the covering mask away from the first groove welding portion.

14. The mask frame assembly according to claim 13, wherein a width of the first covering sub-mask is less than or equal to a width of the gap.

15. The mask frame assembly according to claim 9, wherein a width of the first groove weldless portion is gradually increased in a length direction of the covering mask away from the first groove welding portion.

16. The mask frame assembly according to claim 15, wherein a width of the first covering sub-mask is less than or equal to a width of the gap.

17. The mask frame assembly according to claim 9, wherein a width of the second covering sub-mask is gradually increased in a length direction of the covering mask away from the first groove welding portion.

18. The mask frame assembly according to claim 17, wherein a width of the first covering sub-mask is less than or equal to a width of the gap; and the width of the first covering sub-mask is less than the width of the second covering sub-mask.

19. An evaporation method, comprising:
positioning the mask frame assembly according to claim 1 above a target substrate; and
evaporating material on the target substrate through the mask frame assembly.

* * * * *